United States Patent [19]
Tanabe

[11] Patent Number: 5,900,769
[45] Date of Patent: * May 4, 1999

[54] TWO-DIMENSIONAL CCD HAVING STORAGE CELLS FOR WITHDRAWING CHARGE PACKETS FROM TRANSFER CHANNELS DURING HORIZONTAL SCAN PERIODS

[75] Inventor: Akihito Tanabe, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/725,764

[22] Filed: Oct. 4, 1996

[30] Foreign Application Priority Data

Oct. 4, 1995 [JP] Japan ..................................... 7-257728
Dec. 27, 1995 [JP] Japan ..................................... 7-341525

[51] Int. Cl.$^6$ .......................... G11C 19/28; H01L 27/148; H01L 29/768
[52] U.S. Cl. .......................... 327/515; 257/223; 257/232; 377/58; 377/61
[58] Field of Search .................................. 257/222, 223, 257/231–233; 327/515; 377/58, 61

[56] References Cited

U.S. PATENT DOCUMENTS

| | | | |
|---|---|---|---|
| 4,758,895 | 7/1988 | Elabd | 257/232 |
| 4,803,710 | 2/1989 | Elabd | 257/232 |
| 5,426,317 | 6/1995 | Hirota | 257/232 |

Primary Examiner—Gene M. Munson
Attorney, Agent, or Firm—Sughrue, Mion, Zinn Macpeak & Seas, PLLC

[57] ABSTRACT

A two-dimensional image sensor comprises a matrix array of photodiodes and multiple vertical shift registers horizontally divided into an imaging part and a memory part. During a vertical blanking period, the imaging part receives charge packets from the photodiodes and shifts the charge packets via the memory part to a matrix array of storage cells. During a subsequent horizontal blanking period, the charge packets are restored from the storage cells to the memory part and shifted downwards by the distance of a row so that the charge packets of bottom row are shifted our into a horizontal register. Remaining charge packets are then withdrawn from the memory part to the storage cells and stored therein during a subsequent horizontal scan period. During this horizontal scan period, the memory part is maintained at such a voltage that no dark currents substantially exist and the charge packets in the horizontal register are sequentially delivered to external circuitry.

15 Claims, 13 Drawing Sheets

TWO-DIMENSIONAL CCD HAVING STORAGE CELLS FOR WITHDRAWING CHARGE PACKETS FROM TRANSFER CHANNELS DURING HORIZONTAL SCAN PERIODS

BACKGROUND OF THE INVENTION

1. Field of the Invention

The present invention relates generally to two-dimensional CCD (charge-coupled-device) image sensors of the frame-interline transfer (FIT) mode for use in video cameras, and more specifically to a technique for reducing dark currents.

2. Description of the Related Art

Conventional two-dimensional charge-coupled devices of the FIT mode comprise a matrix array of photo diodes, a plurality of vertical registers and a single horizontal register. The vertical registers are divided into an imaging part and a memory part. The imaging part of the vertical registers is connected to the photodiodes and the memory part is connected to the horizontal register. During a vertical blanking period, electrical charges, or charge packets developed by the photodiodes are transferred to the imaging part of the vertical registers and then transferred downwards to the memory part. Specifically, in the memory part, each charge packet is stored in a potential well. During a subsequent horizontal blanking period, the charge packets are shifted downwards through the memory part to the horizontal register row by row. However, the surface potential of the well is not "pinned" to the storage level of the charge packet, dark currents are generated in the charge transfer channels of the memory part during horizontal scan periods, resulting in a video signal of low signal-to-noise ratio.

In addition, the conventional FIT-mode CCD image sensors can only be used for interlaced scan format. Since computer's video displays employ the non-interlaced scan format, there exists a need for two-dimensional CCD image sensors that can be used in a non-interlaced scan mode.

SUMMARY OF THE INVENTION

It is therefore an object of die present invention to provide a two-dimensional image sensor having low or no dark currents.

Another object of the present invention is to provide a two-dimensional image sensor capable of non-interlaced operation.

According to a first aspect, the present invention provides a two-dimensional image sensor comprising a matrix array of photodiodes, a plurality of vertical shift registers horizontally divided into an imaging part and a memory part, the imaging part being arranged to receive charge packers from the photodiodes and the memory part being arranged to receive the charge packets from the imaging part, a plurality of vertical arrays of storage cells, the storage cells of each vertical array being arranged in a charge transfer relationship with a corresponding one of the vertical registers of the memory part, and a horizontal shift register arranged to receive charge packets from the memory part and sequentially deliver the received charge packets to external circuitry.

Each of the channel cells and each of the storage cells is formed as a semiconductor structure on a substrate. The semiconductor structure comprises a first layer of first conductivity type formed on the substrate, a second layer of second conductivity type on the first layer, the first and second layers having a first portion for defining the channel cell and a second portion adjacent to the first portion, and a region of first conductivity type in the second layer for defining the storage cell with the second portion of the first and second layers, the first and second portions being in a charge transfer relationship with each other.

According to a second aspect, the present invention provides a two-dimensional image sensor comprising a matrix array of photodiodes, a plurality of vertical shift registers horizontally divided into an imaging part and a memory par, a plurality of vertical arrays of storage cells for receiving charge packets from the memory part of the vertical shift registers during the vertical blanking period, a horizontal shift register arranged to receive charge packets row by row from the memory part, and control circuitry for controlling, during a vertical blanking period, the vertical registers and the storage cells for transferring charge packets from the photodiodes to the imaging part, transferring the charge packets from the imaging part via the memory part to the storage cells, controlling, during a horizontal blanking period, the storage cells and the memory part for restoring the charge packets from the storage cells to the memory part, shifting the restored charge packets along the memory part by the distance of a row to the horizontal shift register and withdrawing charge packets from the memory part to the storage cells, and controlling, during a horizontal scan period, the storage cells and the horizontal shift register, for storing the withdrawn charge packets in the storage cells, applying such a potential to the memory part that no dark currents substantially exist therein and transferring charge packets from the horizontal shift register to external circuitry.

According to a third aspect, the present invention provides a method of operating a two-dimensional image sensor comprising a matrix array of photodiodes for producing charge packets, a plurality of vertical shift registers divided into an imaging part and a memory part, a plurality of vertical arrays of storage cells, and a horizontal shift register. The method comprises the steps of a) transferring charge packets from the photodiodes to the imaging part of the vertical shift registers during a vertical blanking period;

b) shifting the charge packets from the imaging part to he memory part of the vertical shift registers during a vertical blanking period;

c) withdrawing the charge packets from the memory part to the storage cells during the vertical blanking period;

d) shifting charge packets from the storage cells back to the memory part of the vertical shift registers during a horizontal blanking period;

e) shifting the charge packers in the memory part of the vertical shift registers by the distance of a row towards the horizontal shift register during the horizontal blanking period;

f) withdrawing remaining charge packets from the memory part of the vertical shift registers to the storage cells during the horizontal blanking period;

g) maintaining the memory part of the vertical shift registers during a horizontal scan period at such a potential that no dark currents substantially exist therein;

h) sequentially shifting charge packets through the horizontal shift register to external circuitry during the horizontal scan period; and i) repeating the steps (d) to (h) a predetermined number of times during the vertical scan period.

BRIEF DESCRIPTION OF THE DRAWINGS

The present invention will be described in further detail with reference to the accompanying drawings, in which.

DETAILED DESCRIPTION

Figure 1:
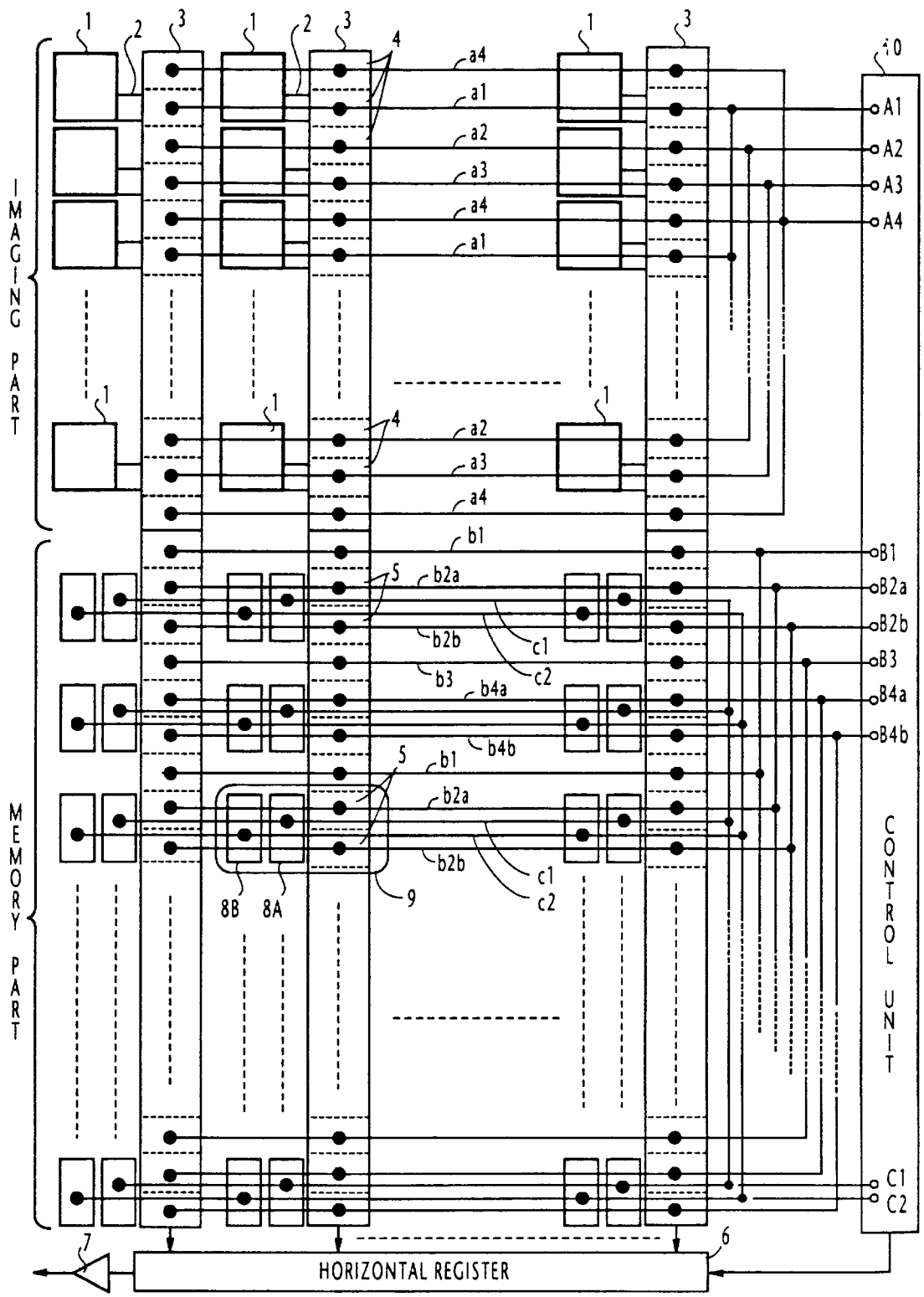
FIG. 1 is a block diagram of a two-dimensional image sensor according to a first embodiment of the present invention.

Referring now to FIG. 1, there is shown a two-dimensional CCD (charge-coupled device) image sensor according to a first embodiment of the present invention. The image sensor is formed by a plurality of photodiodes 1 arranged in a matrix array of rows and columns. A plurality of vertical shift registers 3 (hereinafter vertical registers) are associated respectively with the columns of the photodiode array. The vertical registers 3 are horizontally divided into an imaging part and a memory part. Each vertical register is formed by a plurality of metal-oxide semiconductor (MOS) regions, or channel cells. For purposes of discrimination, the channel cells in the imaging part are indicated by numeral 4 and those in the memory part by numeral 5. The photodiodes of each column are connected by respective transfer gates 2 to MOS regions (channel cells 4) of the associated vertical register 3 and each photodiode corresponds in number to two channel cells 4.

In the imaging part, the channel cells 4 of each vertical register 3 are divided into a plurality of groups of four cells each, and the successive cells of each group are respectively connected by row electrodes a1, a2, a3 and a4 to the corresponding channel cells of the other vertical registers and further to A-terminals A1, A2, A3 and A4 to which four-phase clock voltage pulses are supplied. In response, electrical charges, called charge packets produced in the photodiode array are transferred through the transfer gate 2 to the imaging part of the vertical registers 3. The technique for fabricating the CCD image sensor is well known. In particular, the photodiodes 1 are fabricated using $P^+$-layer to take the advantage of its pinning effect on the potential at the interface between silicon/silicon-dioxide that prevents dark currents.

In the memory part, the channel cells 5 of each vertical register 3 are divided into a plurality of groups of six cells each and the cells of each group are connected by row electrodes b1, b2a, b2b, b3, b4a and b4b to the corresponding cells of the other vertical registers and further to B-terminals B1, B2a, B2b, B3, B4a and B4b to which the four-phase clock voltage pulses are applied to receive and store the charge packets from the imaging part.

The CCD image sensor of this invention additionally includes a plurality of storage cells 8A and 8B, which are vertically arranged in pairs along columns corresponding to the vertical registers 3 and each storage cell pair 8A, 8B corresponds in number to a set of three successive channel cells 5. The storage cells 8A and 8B of each column are respectively connected by row electrodes c1 and c2 to the storage cells 8A, 8B of the other columns and further to C-terminals C1 and C2.

A control unit 10 is provided for supplying voltage pulses to the A-, B- and C-terminals and to a horizontal register 6. Briefly, the operation of the control unit 10 is as follows. During a vertical blanking period, charge packets developed in odd-numbered rows of photodiodes 1 are first transferred to the imaging part of the vertical shaft registers and then to the memory part of the vertical shift registers using voltage pulses supplied to the A- and B-termninals. The B- and C terminals are then driven by successive voltage pulses so that the charge packets are transferred from the memory part to storage cells 8B of odd-numbered rows. During the same vertical blanking period, charge packets in even-numbered rows of the photodiodes are transferred to the imaging part of the vertical shift registers and then to the memory part of the vertical shift registers, and thence to storage cells 8B of even-numbered rows. In this way, the charge packets are stored in the matrix array of storage cells 8B in the same two-dimensional pattern as they are developed in the photo diode array. During a subsequent horizontal blanking period, all charge packets stored in the storage cells 8B are laterally transferred to the channel cells 5 and then transferred downwards by the distance of a row to a horizontal shift register 6 (hereinafter, horizontal register), so that charge packets of a single row are shifted out into the horizontal shift register 6 during each horizontal blanking period. During a subsequent horizontal scan period, the horizontal register 6 is driven by the control unit 10 so chat charge packets are delivered in sequence therethrough to an amplifier 7 for amplification for delivery to an external circuit, not shown, for reproduction of a video image in a non-interlaced (progressive) scan format.

Figure 2:
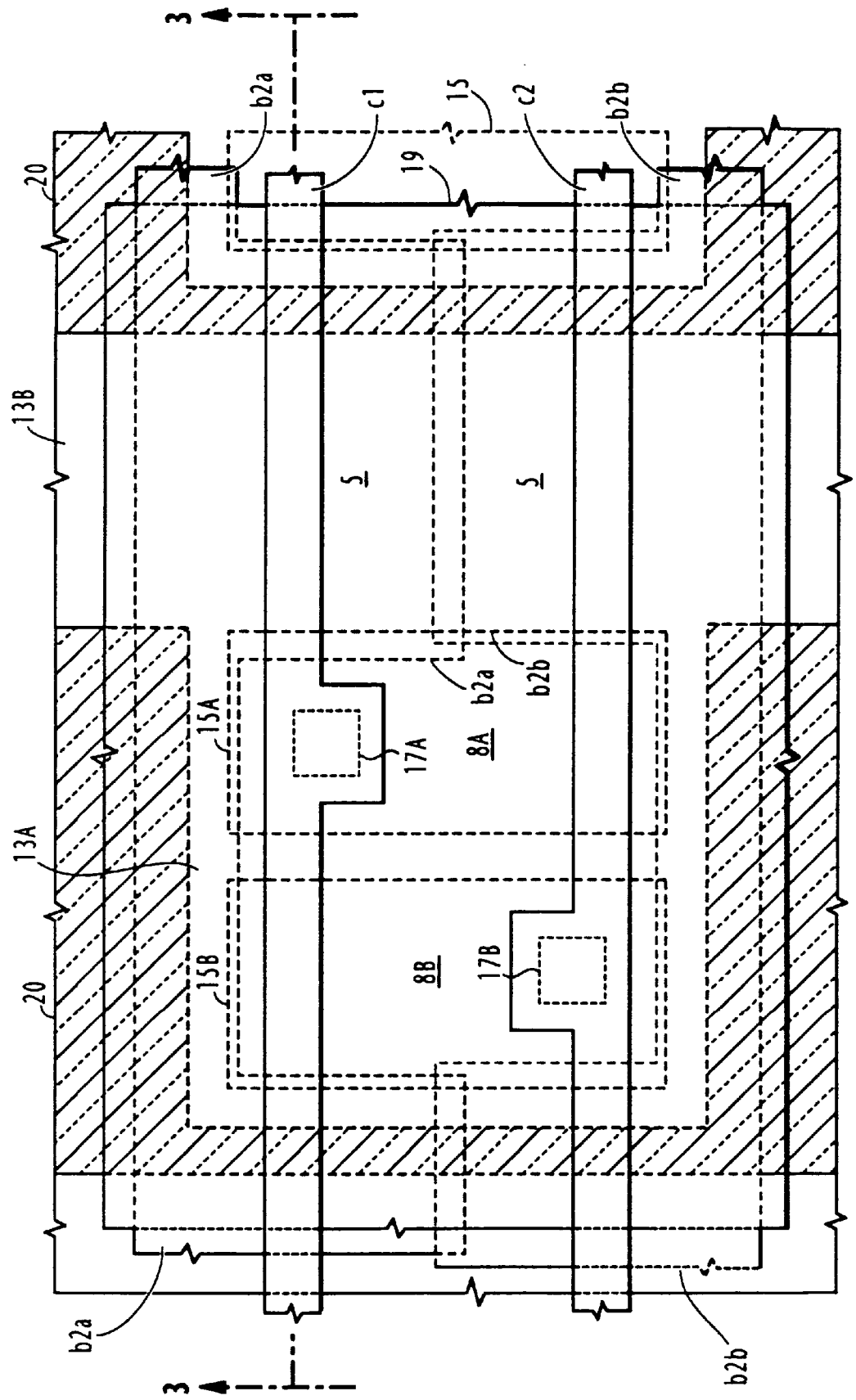
FIG. 2 is a plan view of a portion of the image sensor.
Figure 3:
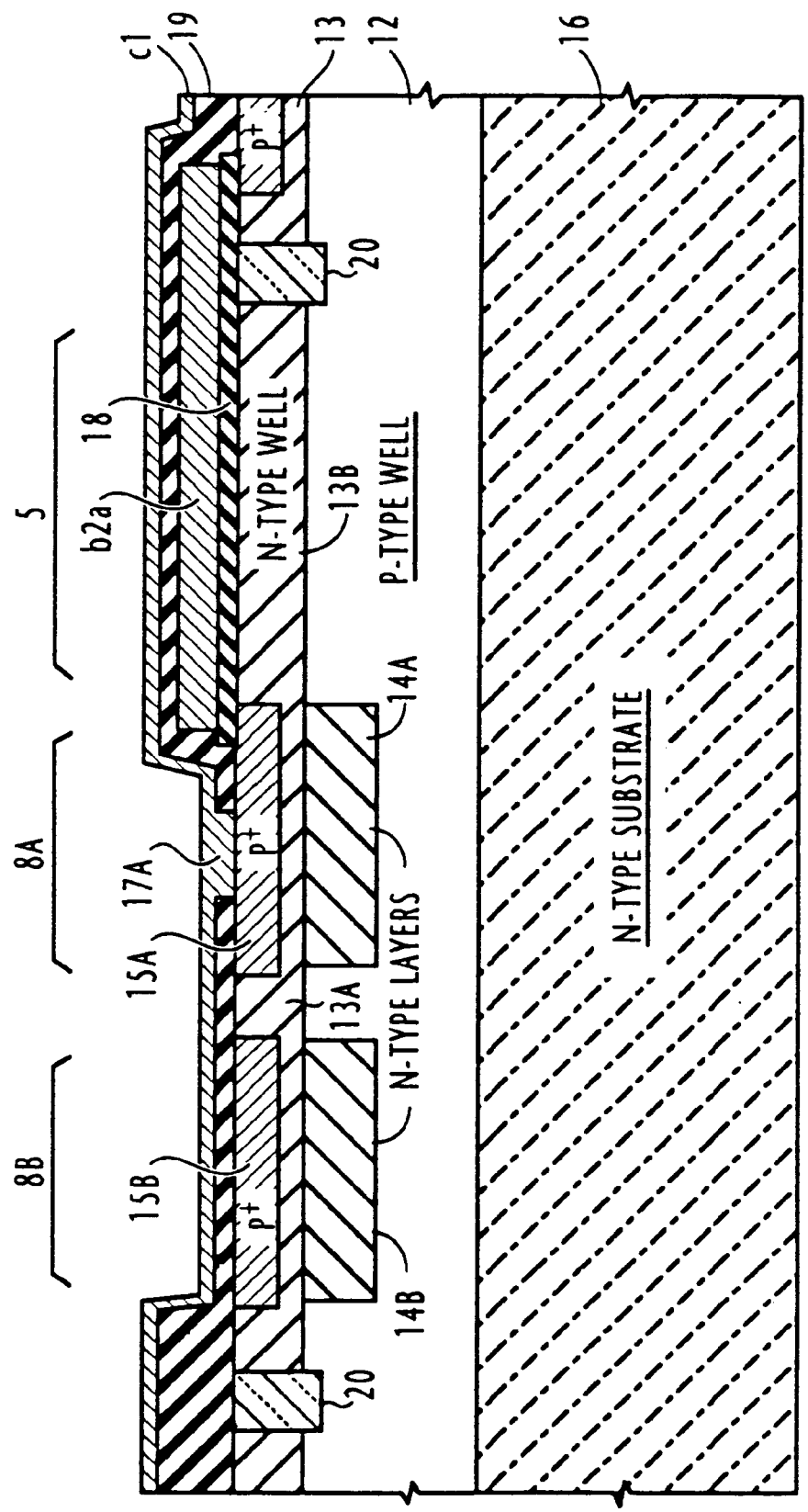
FIG. 3 is a cross-sectional view taken along the lines 3—3 of FIG. 2.

A portion of the memory part enclosed by a rectangle 9 in FIG. 1 encompasses a pair of storage cells 8A and 8B and two channel cells 5 and details of this portion 9 are illustrated in FIGS. 2 and 3. On an N-type substrate 16 is formed a P-type well 12 in which a pair of N-type layers 14A and 14B are embedded. On the P-type well 12 is formed an N-type well 13, which is bounded by device separators 20 and extends horizontally to provide a storage portion 13A overlying the N-type embedded layers 14A and 14B and extends vertically through the whole length of the vertical register 3 to provide a channel portion 13B. In the storage portion 13A and above the N-type embedded layers 14A and 14B are $P^+$-type regions 15A and 15B. Polysilicon row electrodes b2a and b2b extend in parallel in a direction normal to the length of channel portion 13B. A portion of each of row electrodes b2a, b2b that is immediately above the channel portion 13B extends in the direction of the channel portion 13B so that it partially overlaps the corresponding portion of the other row electrode with a silicon-dioxide layer, not shown, being interposed therebetween for purposes of insulation and charge transfer between camel cells 5. In addition, this portion of each row electrode b2 extends somewhat in the row direction so that it partially overlaps adjacent $P^+$-layer 15A. A silicon dioxide layer 18 is provided between the charge transfer channel 13B and the polysilicon electrodes b2a, b2b. A transfer cell 5 is formed by a portion of the P-type well 12 and the N-type channel portion 13B. The entire surface of the device is then coated with a silicon dioxide layer 19, which is then etched. A pair of electrodes c1 and c2 is formed on the insulating layer 19 and these electrodes are connected through the etched portions to the $P^+$-type layers 15A and 15B by respective contacts 17A and 17B. Storage cells 8A, 8B are formed by the P-type layer 12, N-type layers 14A, 14B, storage portion 13A of the N-type well 13, and $P^+$-layers 15A, 15B.

Figure 4:
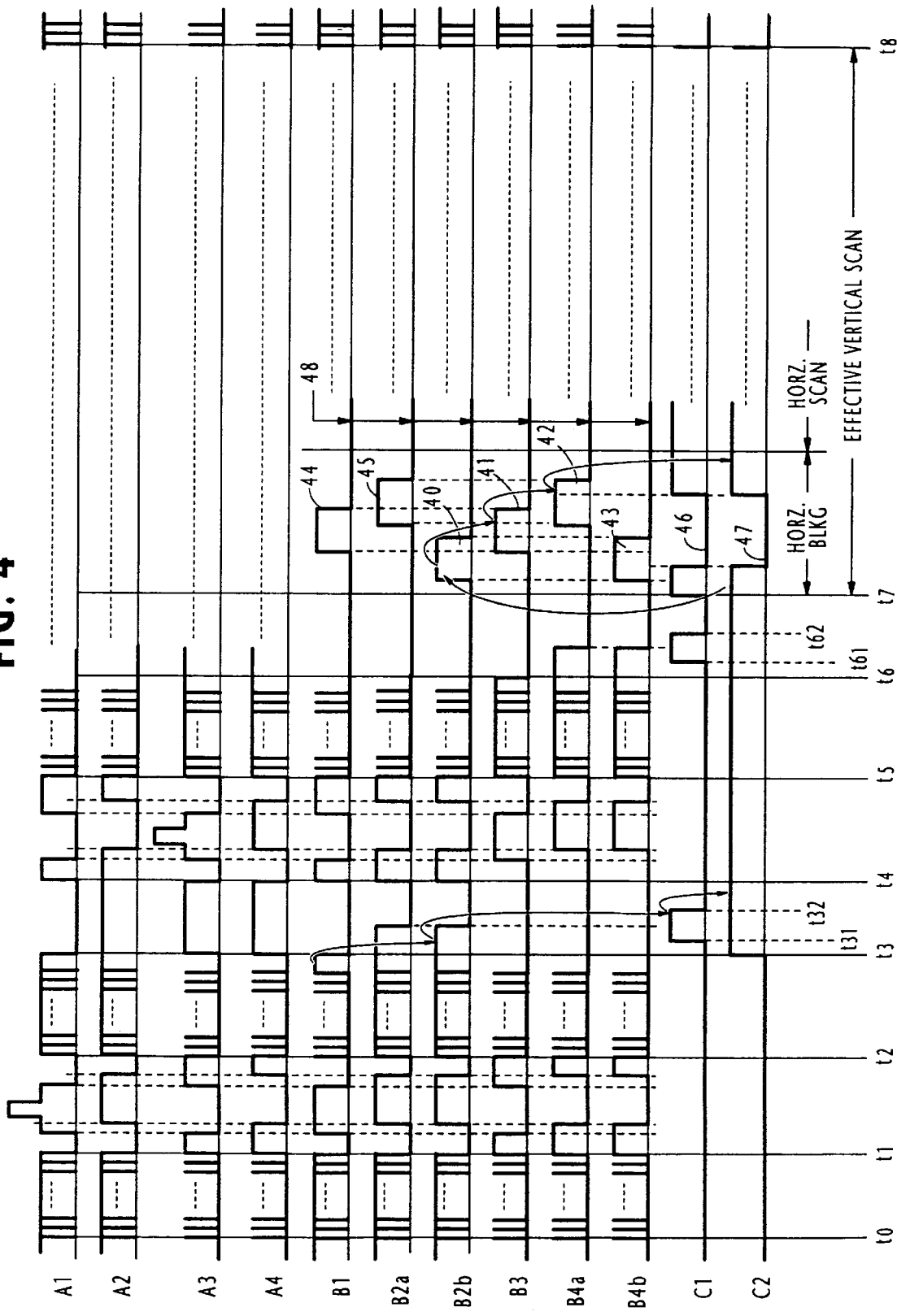
FIG. 4 is a timing diagram showing the operation of the control unit of FIG. 1.

FIG. 4 is a timing diagram illustrating the operation of the control unit 10 of the first embodiment. Note that a period $t_0$–$t_7$ corresponds to a vertical blanking period during which terminals B2a and B2b are supplied with voltage pulses of same level and phase to operate The corresponding channel cells 5 at equipotential and terminals B4a and B4b are supplied with voltage pulses of same level and phase to operate at equipotential. With these unitary operations, charge packers are transferred through the vertical registers of the memory part using the same four-phase clock voltages as those used by the cells 4 of the imaging part.

During a period to $t_0$–$t_1$ spurious charges which may be present in the image sensor are purged from the CCD by the application of four-phase voltage pulses (typically at 500 kHz to 2 MHz) to the A- and B-terminals. Specifically, negative- and positive-going voltage pulses of four successive phases are used to drive the A-terminals and B-terminals.

Figure 5A:
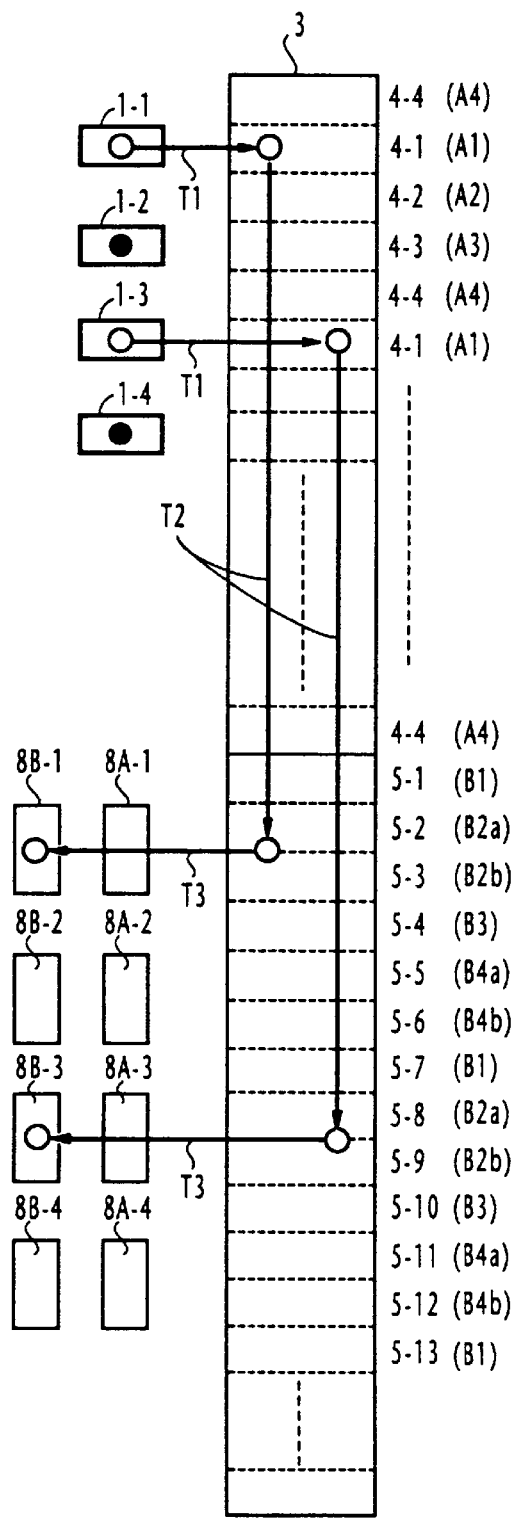
FIG. 5A is a schematic illustration useful for an understanding of the operation of the first embodiment for transferring the charge packets of odd-numbered rows from the imaging part to the memory part of the image sensor.

During a period $t_1$–$t_2$, charge packets from the photodiodes of odd-numbered rows are horizontally transferred to the corresponding storage cells 4 by applying an excitation (peak) voltage pulse and a high (logic-1) level voltage pulse of successive phases to terminals A1 and A2, respectively, and a low (logic-0) level voltage pulses of successive phases to terminals A3 and A4. Concurrently, high level voltage pulses of successive phases are supplied to terminals B1, B2a, B2b and low level voltage pulses of successive phases to terminals B3, B4a, B4b. As a typical example shown in FIG. 5A, charge packets in photodiodes 1—1 and 1-3 are transferred to corresponding cells 4-1 as indicated by arrows T1 during period $t_1$–$t_2$.

During the next period $t_2$–$t_3$, the charge packets of odd-numbered rows are transferred down the vertical registers 3 from the imaging part to the memory part by the application of voltage pulses to the A- and B-terminals similar to those used during $t_0$–$t_1$. Since terminals B2a and B2b are driven to a same potential and terminals B4a and B4b are also driven to another same potential, the charge packet of first row, for example, is moved from cell 4-1 (connected to terminal A1) to cell 5-2 where it disperses and accumulates on the equipotential cells 5-2 and 5-3, and the charge packet of third row moves to cell 5-8 and accumulates on the equipotential cells 5-8 and 5-9, as indicated by arrows T2 (see FIG. 5A). Note that during the period $t_0$–$t_3$, terminals C1 and C2 are maintained at low voltage level.

During the next period $t_3$–$t_4$, the charge packets of first and third rows are transferred horizontally from channel cells 5 to corresponding storage cells 8B. This is accomplished by setting, at time $t_3$, the terminals B2a, B2b and C2 to high and the terminals B1, B3, B4a, B4b to low, and setting the terminal C1 to high at time $t_{31}$. As a result, storage cells 8A, 8B are biased to equipotential and the charge packet of first row is transferred to storage cells 8A-1 and 8B-1, and the charge packer of third row is transferred to storage cells 8A-3 and 8B-3. By setting the terminal C1 to low at time $t_{32}$ to develop a potential difference between terminals C1 and C2, these charge packets are transferred to cells 8B-1 and 8B-3 (arrows T3, FIG. 5A). With a low voltage being supplied to terminal C1 at time $t_{32}$ and thereafter, all the storage cells 8A are turned off to prevent leakage of charges due to potential differences which occur as a result of the presence of charge packets remaining in the even-numbered rows of photodiodes 1. Thus, the storage cells 8A act as a switching gate during period $t_3$ to $t_6$. Note that terminal C2 is maintained at high voltage level until a point in time immediately after $t_7$.

During period $t_4$–$t_5$, charge packets from the photodiodes of even-numbered rows are horizontally transferred to the imaging part of the vertical registers by applying an excitation pulse and a high level voltage pulse of successive phases to terminals A3 and A4, and low level voltage pulses of successive phases to terminals A1 and A2. Concurrently, the low level voltage pulses are supplied to terminals B1, B2a, B2b and the high level voltage pulses to terminals B3, B4a, B4b. Charge packets in photodiodes 1-2 and 1-4 are transferred to corresponding cells 4-3 as indicated by arrows T4 during period $t_4$–$t_5$ (FIG. 5B).

During period $t_5$–$t_6$, the charge packets of even-numbered rows in the imaging part are transferred therethrough to the channel cells 5 of even-numbered rows by the application of voltage pulses to the A- and B-terminals similar to those used during $t_0$–$t_1$. Therefore, in FIG. 5B, the charge packet of second row is moved to cells 5-5 and 5-6 which are at equipotential and the charge packet of fourth row is moved to cells 5-11 and 5-12 which are also at equipotential (arrows T5).

During the next period $t_6$–$t_7$, the charge packets of second and fourth rows are transferred horizontally to storage cells 8B in a manner similar to the previous period $t_3$–$t_4$ by setting, at time $t_6$, the terminals B4a, B4b and C2 to high and the terminals B1, B2a, B2b, B3 to low, and setting, at time $t_{61}$, the terminal C1 to high, As a result, the charge packet of second row moves to storage cells 8A-2 and 8B-2 and the charge packet of fourth row moves to storage cells 8A-4 and 8B-4. By setting the terminal C1 to low at time $t_{62}$, developing a potential difference between terminals C1 and C2, these charge packets accumulates on cells 8B-2 and 8B-4 (arrows T6).

Figure 5B:
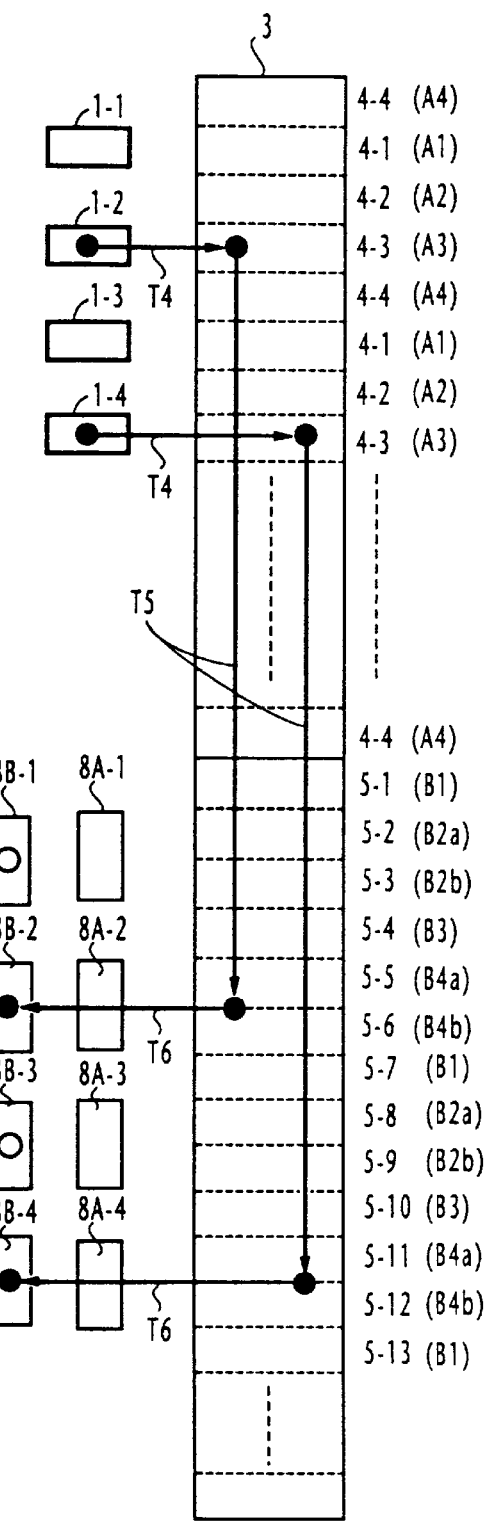
FIG. 5B is a schematic illustration useful for an understanding of the operation of the first embodiment for transferring the charge packets of even-numbered rows from the imaging part to the memory part of the image sensor.

It is seen from FIG. 5B that all charge packets developed by the photodiode array are stored in the same two-dimensional array in the storage cells 8B.

An effective vertical scan begins at time $t_7$ and ends at time $t_8$. A sequential readout operation is repeatedly performed on the charge packets stored in a two-dimensional pattern during each of subsequent horizontal blanking periods. During each horizontal blanking period, the B-terminals are supplied with two sets of three phase voltage pulses such that terminals B2b and B4b are supplied with a pulse of first phase, the terminals B1 and B3 are supplied with a pulse of second phase and the terminals B2a and B4a are supplied with a pulse of third phase.

Figure 5C:
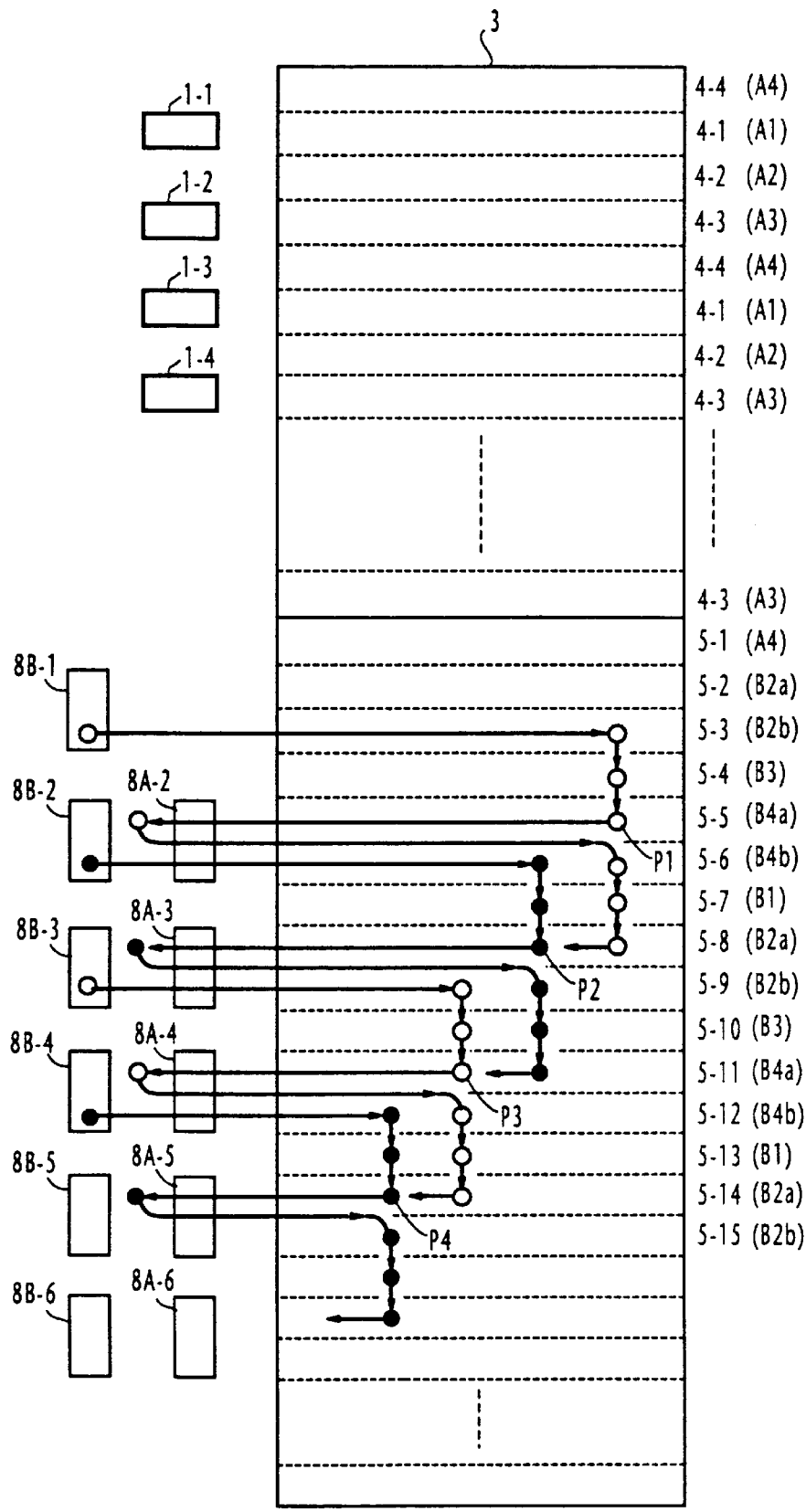
FIG. 5C is a schematic illustration useful for an understanding of the operation of the first embodiment when sequentially transferring the charge packets of odd- and even-numbered rows from the memory part to a horizontal register.

More specifically, in response to a first-phase pulse 40 applied to terminal B2b, the charge packets P1 and P3 of the first and third rows are restored from storage cells 8B-1 and 8B-3 to the memory part of the vertical shift registers and stored in channel cells 5-3 and 5-9 (connected to terminals B2b), respectively, as shown in FIG. 5C. In response to pulses 41 and 42 applied respectively to terminals B3 and B4a, the packets PI and P3 are successively moved along the vertical register to channel cells 5-5 and 5-11, respectively. The terminals C1 and C2 are set to low level at the same time as indicated by low level pulses 46, 47 when pulses 40, 41 and 42 are produced in sequence. Immediately prior to the trailing edge of the third pulse 42, the terminals C1 and C2 are set to high level so that, when the terminal B4a is set To low in response to the trailing edge of pulse 42, the charge packet P1 is horizontally moved from cell 5-5 to cells 8A-2 and 8B-2 and the charge packet P3 is horizontally moved from channel cell 5-11 to storage cells 8A-4 and 8B-4. During the vertical scan period, the terminals C1 and C2 are driven by the same voltage pulses. Therefore, storage cells 8A do not function as a switching device, but cooperate with storage cells 8B to store a common charge packet.

In a similar manner, a first-phase pulse 43 is applied to terminal B4b to transfer the charge packets P2 and P4 of the second and fourth rows back from storage cells 8B-2 and 8B-4 to channel cells 5-6 and 5-12 (connected to terminals B4b), respectively, and second and third pulses 44 and 45 are applied respectively to terminals B 1 and B2a to successively move the packets P2 and P4 along the vertical register to channel cells 5-8 and 5-14, respectively. Immediately prior to the leading edge of the third pulse 45, the terminals C1 and C2 are set to high level so that, when the terminal B2a is set to low level in response to the trailing edge of pulse 45, the charge packet P2 is move from cell 5-8 to cells 8A-3 and 8B-3 and the charge packet P4 is moved from channel cell 5-14 to cells 8A-5 and 8B-5.

Therefore, during a first horizontal blanking period, charge packets P1, P2, P3 and P4 are transferred to respective cells (8A-2, 8B-2), (8A-3, 8B-3), (8A-4, 8B4) and (8A-5, 8B-5), as illustrated in FIG. 5C, and stored therein during a subsequent horizontal scan period. During a second horizontal blanking period, these packets are transferred to cells (8A-3, 8B-3), (8A4, 8B-4), (8A-5, 8B-5) and (8A-6, 8B-6) and stored therein during a second horizontal scan period. During each horizontal blanking period, voltage pulses 40 to 47 are generated and the charge packers of bottom row are transferred to the horizontal register 6 and remaining charge packers are withdrawn from the memory part of the vertical registers. During each subsequent horizontal scan period, the withdrawn charge packets are held in the storage cells 8A, 8B and the charge packets in the horizontal shift register 6 are sequentially delivered to the output amplifier 7.

Returning to FIG. 3, it is appropriate to explain another advantage of the present invention. When the charge packets are withdrawn from the channel cells 5 during the horizontal scan period, they are stored in the embedded N-type layers 14A and 14B. When this occurs, majority carriers (holes) are present in abundance at the $SiO_2$/Si interface between the $SiO_2$ layer 19 and the Pi-layer 15B and, as a result, no dark current is produced by the storage cells 8A and 8B under the effect of a surface potential similar to the pinning effect of photodiodes 1. Because of the storage of charge packets in the storage cells 8B away from the transfer channels of the vertical registers 3, all the channel cells 5 are maintained at low voltage level during horizontal scan periods as indicated by numeral 48 in FIG. 4. As a result, holes are present in abundance at the $SiO_2$/Si interface between the $SiO_2$ layer 18 and the N-type well 13B, and dark currents which would occur in the vertical registers 3 during horizontal scan periods are reduced to a minimum.

As described above, the purpose of the provision of storage cells 8A is to operate them as a switching element between the vertical register 3 and the storage cell 8B to prevent a loss of charges due to potential differences which might develop when charge packets of odd-numbered rows are moved to the memory part while charge packets of even-numbered rows still remain in the imaging part. It is seen that when all the charge packets have been moved to the memory part, storage cells 8A and 8B operate as a single memory unit. While two storage cells are used for scoring a charge packet, the storage cells 8A of even-numbered rows may be dispensed with because of the absence of charges in the imaging part when charge packets of even-numbered rows are transferred to the memory part.

Figure 6:
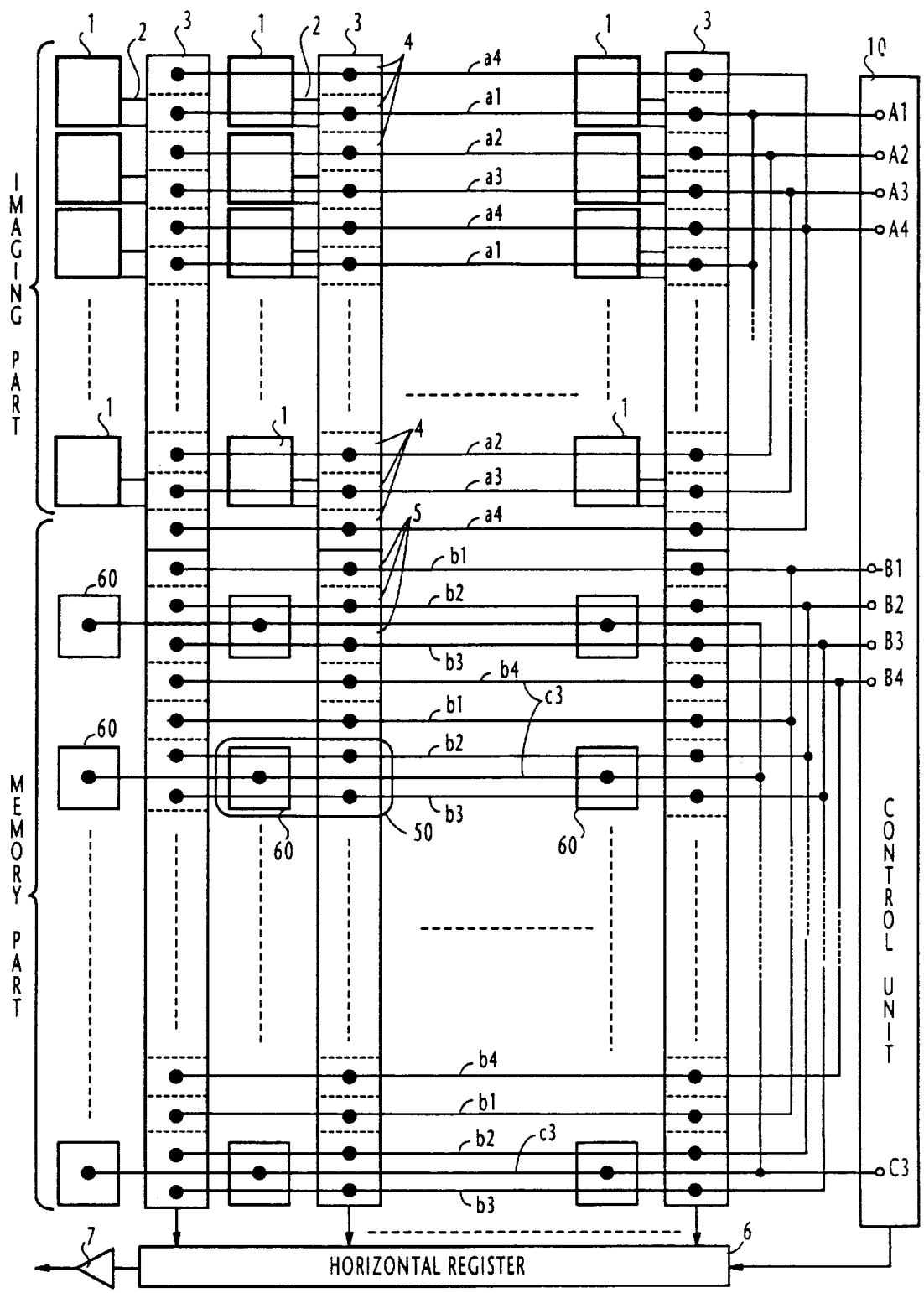
FIG. 6 is a block diagram of a two-dimensional image sensor according to a second embodiment of the present invention.

A simplified version of the present invention can be implemented as illustrated in FIG. 6 to take advantage of the low or no dark currents. This embodiment is based on the interlaced scan format, and differs from the first embodiment in that the cells 5 of the memory part of the vertical shift registers are divided into a plurality of groups of four cells each. The cells 5 of each of these groups are connected by lines b1, b2, b3 and b4 to the cells of the other vertical registers and further to terminals B1, B2, B3 and B4 which are respectively supplied with four-phase clock voltage pulses. Furthermore, the second embodiment includes a matrix array of storage cells 60. The cells 60 of each column are connected by lines c3 to the cells 60 of the other vertical registers and further to a terminal C3. Note that the cells 60 are provided one for each group of four cells 5.

Figure 7:
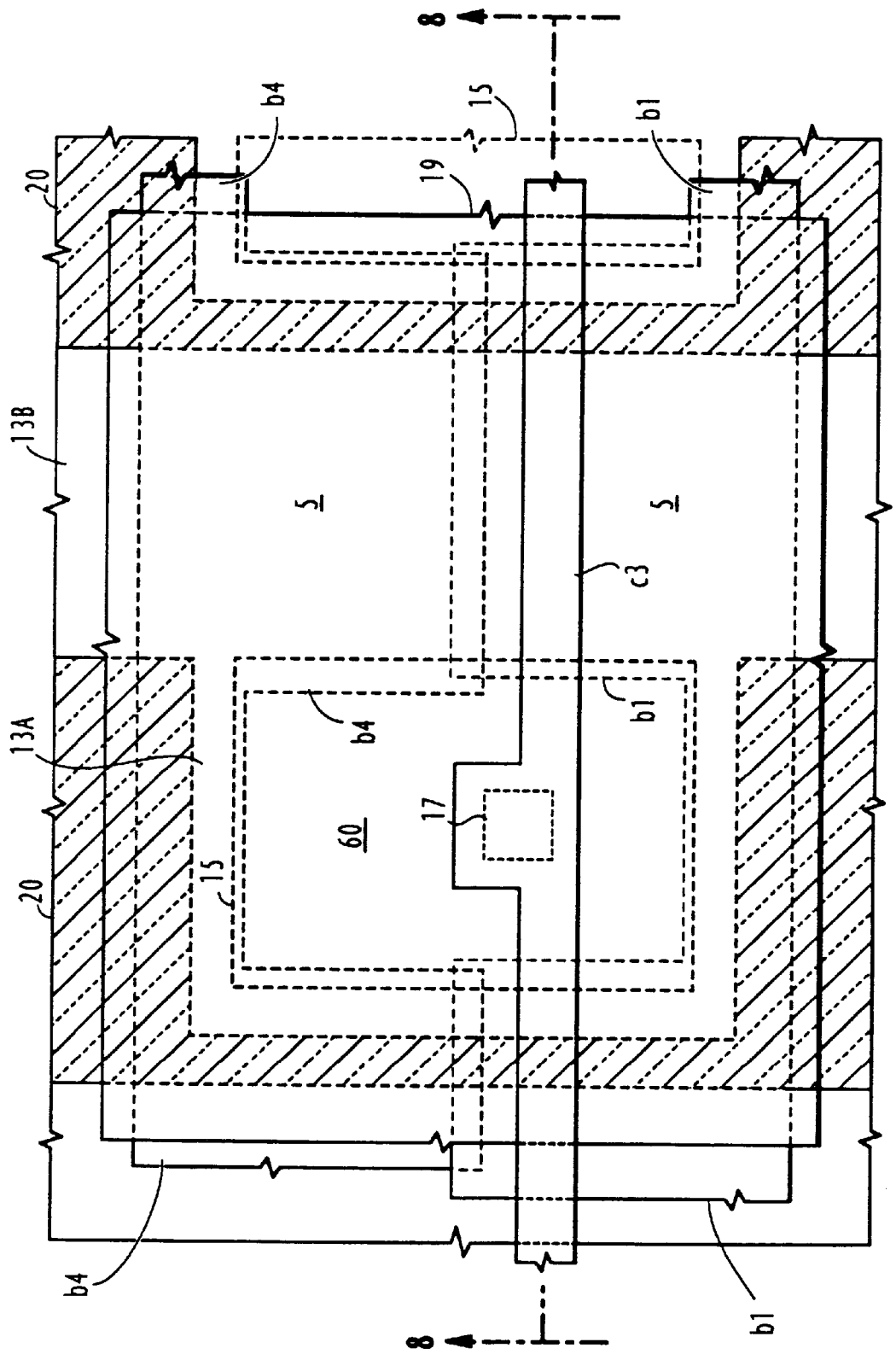
FIG. 7 is a plan view of a portion of the image sensor of the second embodiment of this invention.
Figure 8:
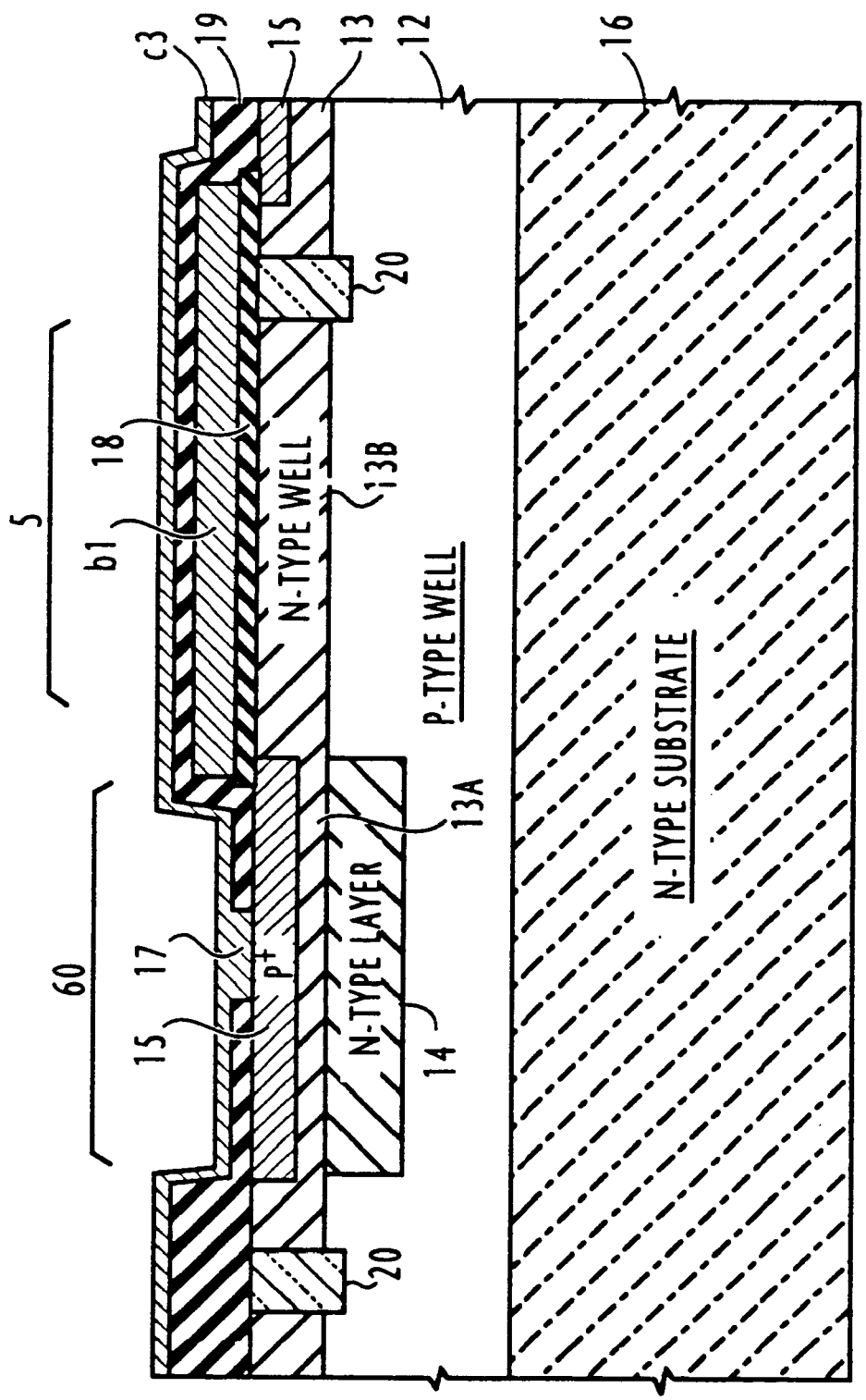
FIG. 8 is a cross-sectional view taken along the lines 8—8 of FIG. 7.

A portion of the memory part enclosed by a rectangle 50 in FIG. 6 encompasses a storage cell 60 and two channel cells 5 and details of this portion 50 are illustrated in FIGS. 7 and 8. It is seen that the portion 50 differs from the previous embodiment by removing the row electrode c1 and designating the row electrode c2 of the previous embodiment as c3. Furthermore, a single $P^+$-type region 15 is provided instead of the two $P^+$-type regions 15A and 15B, this region 15 being connected by contact 17 to the row electrode c3 and overlying a single embedded N-type layer 14.

Figure 9:
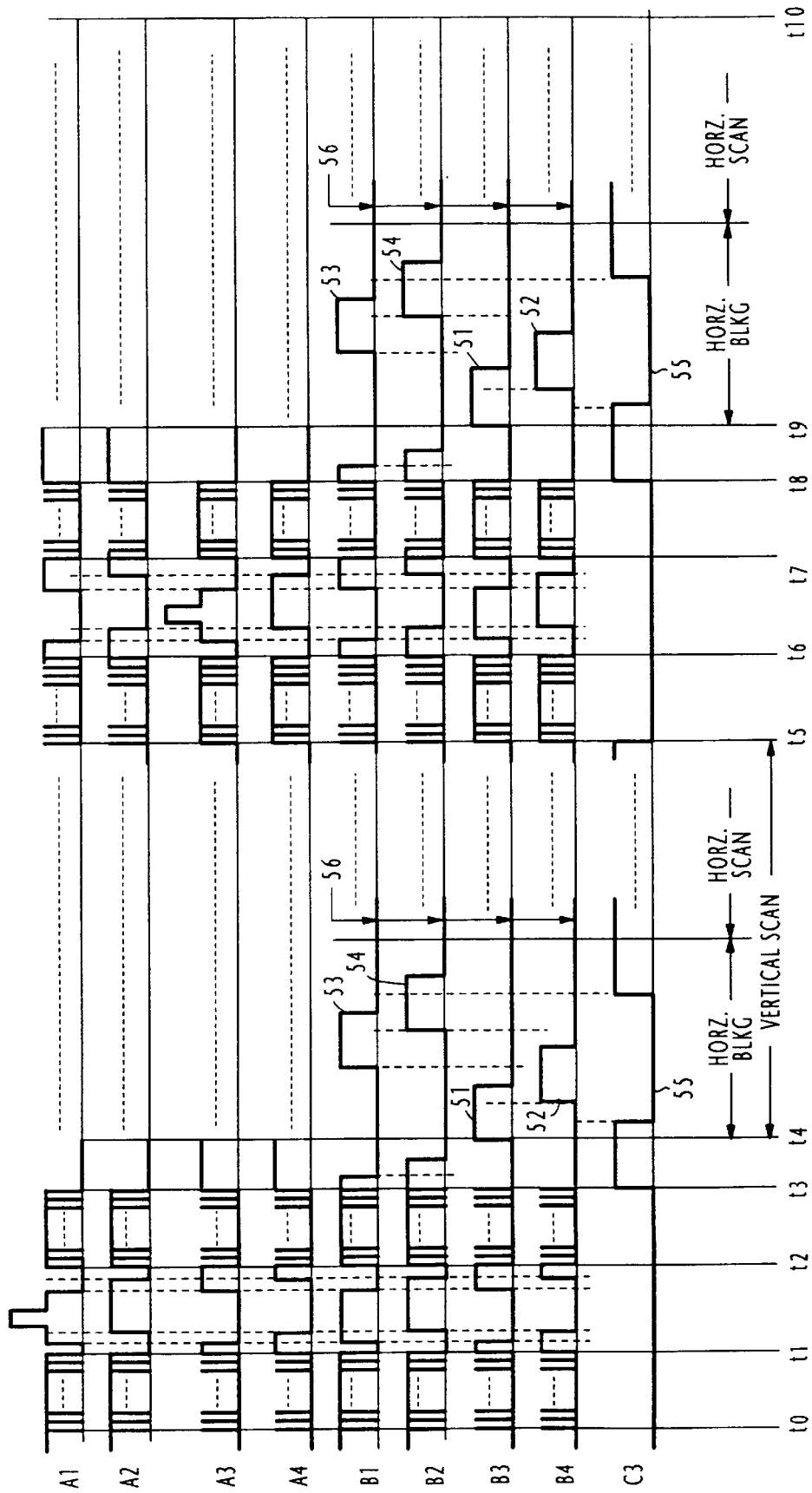
FIG. 9 is a timing diagram of the operation of the control unit of FIG. 6.

FIG. 9 is a timing diagram illustrating the operation of the image sensor of the second embodiment. According to the second embodiment, period $t_0$–$t_4$ and period $t_5$–$t_9$ correspond to vertical blanking periods. Similar to the previous embodiment, removal of spurious charges is performed during periods $t_0$–$t_1$ and $t_5$–$t_6$ by the application of four-phase voltage pulses.

Figure 10A:
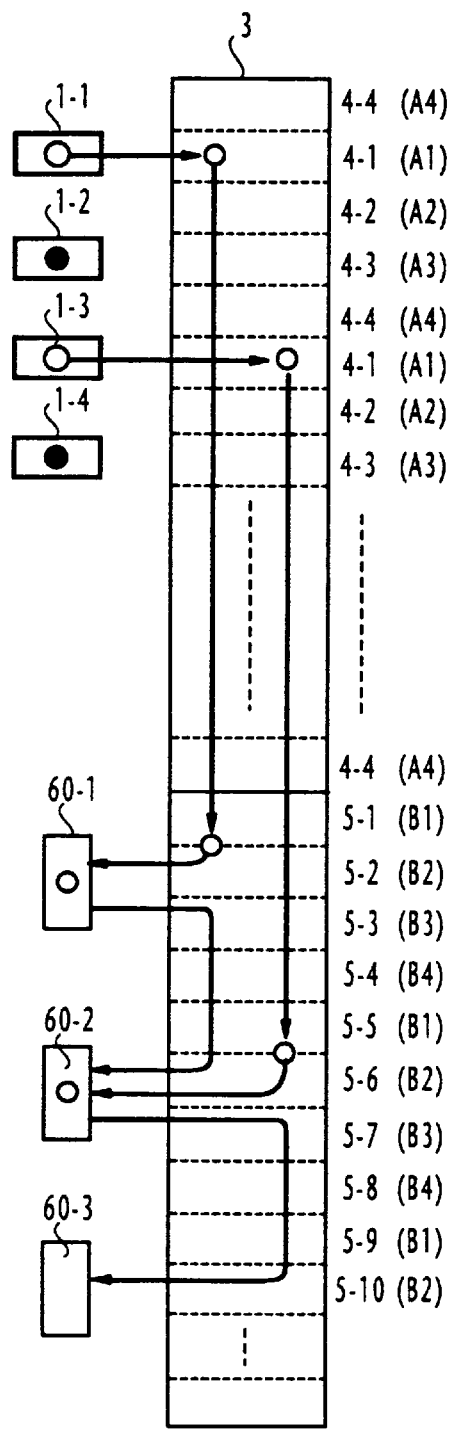
FIG. 10A is schematic illustration useful for an understanding of the operation of the second embodiment during an odd-numbered field of interlaced scan.

During period $t_1$–$t_2$, charge packets from odd-numbered rows of the photodiodes are horizontally transferred to the imaging part by applying an excitation voltage pulse and a high level voltage pulse of successive phases to terminals A1 and A2 and low level voltage pulses of successive phases to terminals A3 and A4. Concurrently, the high level voltage pulses are supplied to terminals B1 and B2 and the low level voltage pulses to terminals B3 and B4. As shown in FIG. 10A, the charge packets developed in odd-numbered row photodiodes 1—1 and 1-3, for example, are transferred to corresponding cells 4-1.

During period $t_2$–$t_3$, the odd-numbered charge packets are transferred from the imaging part to the memory part by the application of four-phase voltage pulses to the A- and B-terminals similar to those used during $t_0$–$t_1$. Therefore, at time $t_3$, the first-row charge packer in each vertical register is moved to equipotential cells 5-1 and 5-2 and the third-row charge packet is moved to equipotential cells 5-5 and 5-6 as shown FIG. 10A. Note that during period $t_0$–$t_3$ the terminal C3 is maintained at low voltage level to isolate the storage cells 60 from the channel cells 5.

During period $t_3$–$t_4$, the terminal C3 is set to high, terminals B3, B4 are set to low, and terminals B1 and B2 are successively set to low at delayed timing so that the first- and third-row charge packets of each vertical column are withdrawn from their vertical register to the corresponding storage cells 60-1 and 60-2, respectively (FIG. 10A).

During the next period $t_4$–$t_5$, which corresponds to an effective odd-numbered vertical scan period, four-phase high voltage pulses 51, 52, 53, 54 are produced in sequence at horizontal scan intervals and supplied to the terminals B3, B4, B1 and B2, respectively, while the terminal C3 is supplied with a low-voltage pulse 55. By the application of these pulses 51 to 55, the first-row charge packet is restored to the vertical register and moved through channel cells 5-3, 54, 5-5 to cell 5-6 and withdrawn to storage cell 60-2. The third-row charge packet is restored back to the vertical register and moved through channel cells 5-7, 5-8, 5-9 to cell 5-10 and withdrawn to storage cell 60-3 (FIG. 10A). In this way, during each horizontal blanking period, the charge packets of all odd-numbered rows are moved downwards by the distance of a row and those at the bottom row are shifted out into the horizontal register 6 and remaining charge packets are withdrawn to storage cells 60. During a subsequent horizontal scan period, the withdrawn charge packets are held in the storage cells and the charge packets in the horizontal shift register 6 are sequentially delivered to the amplifier 7.

A similar process is then performed on the photodiodes of even-numbered rows during period $t_5$ to $t_{10}$ in which period $t_5$ to $t_8$ defines a vertical blanking period and period $t_9$ to $t_{10}$ defines an effective even-numbered vertical scan period. This begins at time $t_6$ following the removal of spurious charges during period $t_5$–$t_6$.

Figure 10B:
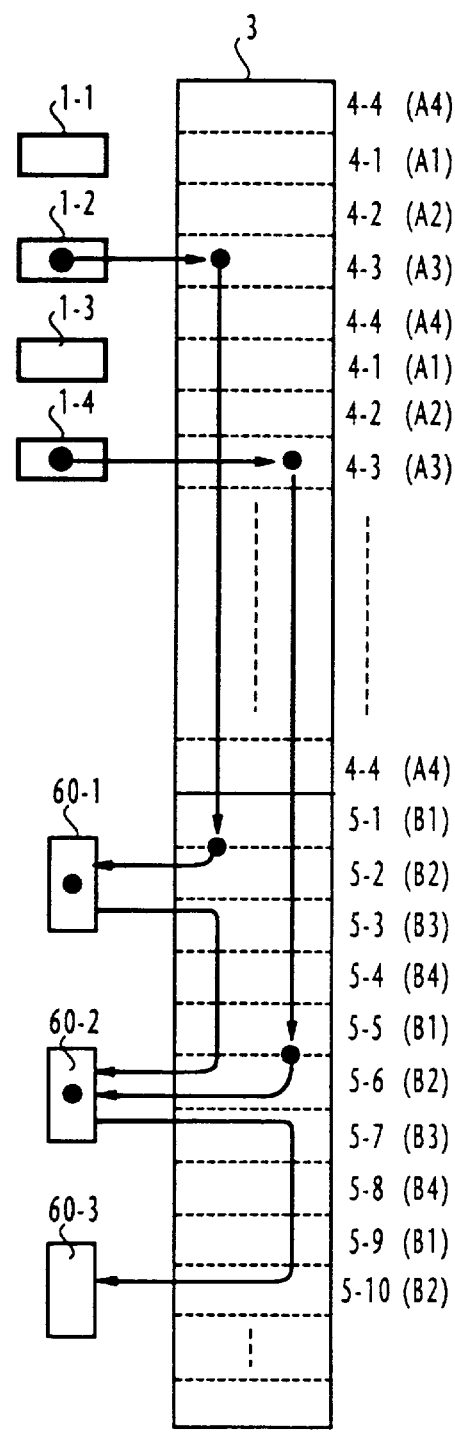
FIG. 10B is a schematic illustration useful for an understanding of the operation of the second embodiment during an even-numbered field of interlaced scan.

During period $t_6$–$t_7$, charge packets from the photodiodes of even-numbered rows are horizontally transferred to the corresponding storage cells 4 by applying a highest peak level and a high level voltage pulse to terminals A3 and A4, respectively, and a low level voltage pulse to terminals A1 and A2. Concurrently, the low level voltage pulse is supplied to terminals B1 and B2 and the high level voltage pulse to terminals B3 and B4, so that the charge packets in photodiodes 1-2 and 1-4, for example, are transferred to corresponding cells 4-3 as shown in FIG. 10B.

During period $t_7$–$t_8$, the charge packets of even-numbered rows are transferred downwards to memory channel cells 5 by the application of similar four-phase voltage pulses to the A- and B-terminals to those used during $t_0$–$t_1$ with the exception that these pulses are delayed by the period of two phases. As a result, the charge packers of even-numbered rows are transferred from cells 4-3 to cells 5-1 as shown FIG. 10B as in the case of the odd-numbered rows. During period $t_5$–$t_8$ the terminal C3 is maintained at low voltage level to isolate the storage cells 60 from the channel cells 5.

With respect to the B- and C-terminals, period $t_8$–$t_9$ is identical to period $t_3$–$t_4$. Thus, during this period, the charge packets of even-numbered rows are transferred from channel cells 5-1 to storage cells 60-1 and 60-2 as shown in FIG. 10B.

During the next vertical scan period $t_9$–$t_{10}$, four-phase high voltage pulses 51, 52, 53, 54 are produced in sequence at horizontal scan intervals and supplied to the terminals B3, B4, B 1 and B2, respectively, while the terminal C3 is supplied with a low-voltage pulse 55. By the application of these pulses, the second- and fourth-row charge packets are restored to the vertical register and shifted along and withdrawn to storage cells 60-2 and 60-3, respectively, in the same manner as in the case of the odd-numbered charge packers (FIG. 10B). During each horizontal blanking period, the charge packets of all the even-numbered rows are therefore moved downwards by the distance of a row and those of bottom row are entered into the horizontal register 6 and sequentially delivered to the amplifier 7.

Returning to FIG. 8, when the charge packets are transferred to the storage cell 60, they are stored in the embedded N-type layer 14 during a horizontal scan period. Majority carriers are present in abundance at the $SiO_2$/Si interface between the $SiO_2$ layer 19 and the $P^+$-layer 15 and no dark current is produced by the storage cells 60 due to the same pinning effect as that of photodiodes 1. Because of the storage of the charge packers in the storage cells 60 away from the transfer channels of the vertical registers 3, all the channel cells 5 are maintained at low voltage level during horizontal scan periods as indicated by numeral 56 in FIG. 9. Thus, holes are present in abundance at the $SiO_2$/Si interface between the $SiO_2$ layer 18 and the N-type well 13B serve to minimize dark currents which might occur in the channel cells 5 during horizontal scan periods.

Figure 11:
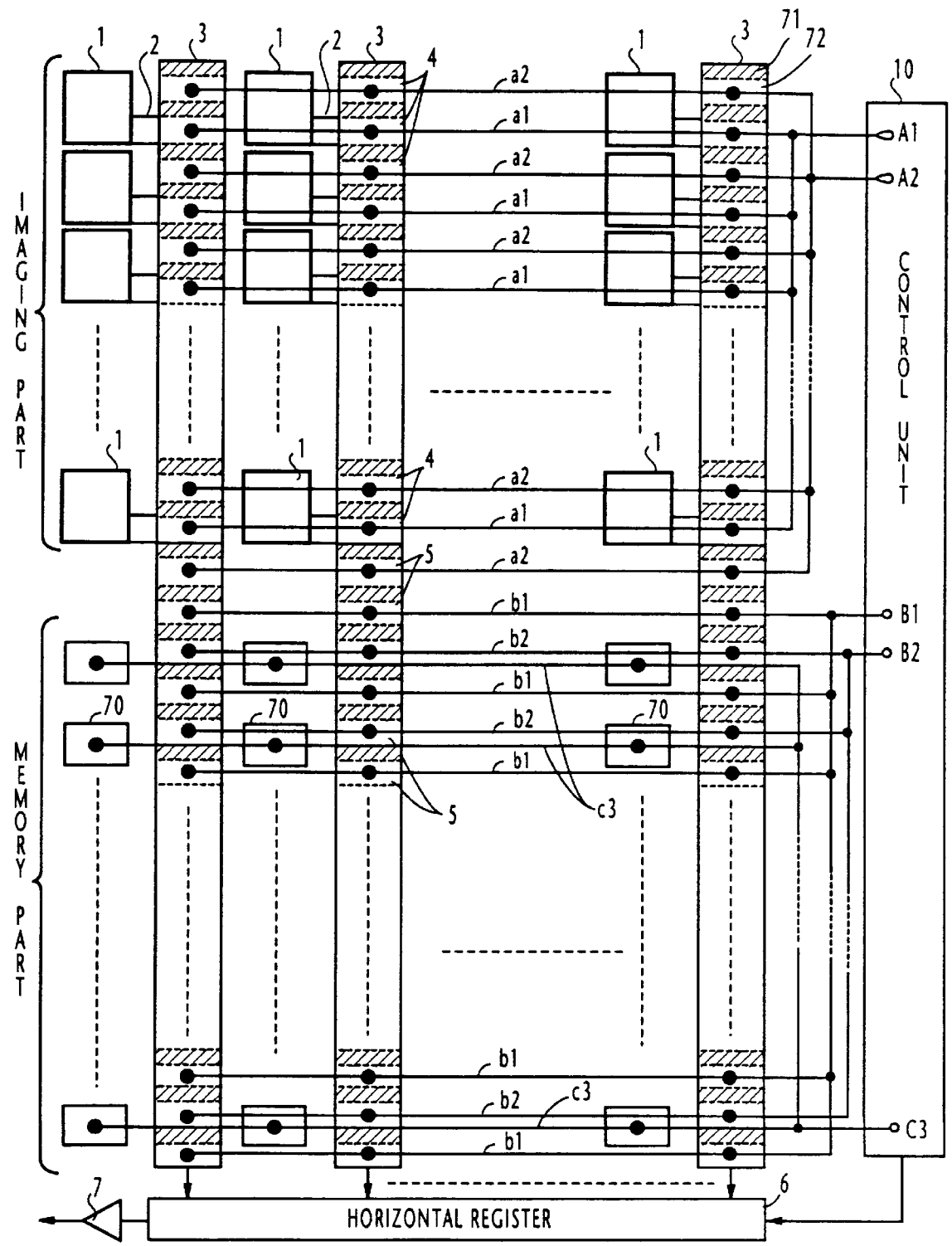
FIG. 11 is a block diagram of a two-dimensional image sensor according to a third embodiment of the present invention.

Although the use of four phase clock voltage pulses is advantageous for driving a progressive scan image sensor of the type shown in FIG. 1 because of its high charge transfer capability, a need may exist for a simplified version of the progressive scan image sensor by using two-phase clock voltages. As shown in FIG. 11, a simplified image sensor is similar to the embodiment of FIG. 6 with the exception that it uses only two terminals A1, A2 in the imaging part and two terminals B1 and B2 in the memory part to receive respective two-phase clock voltage pulses and that storage cells 70 are provided one for each pair of two channel cells 5. Furthermore, each of the channel cells 4 and 5 is divided into a barrier region 71 and a storage region 72 formed using a known technique such as ion injection so that theses regions have different impurity concentrations. A charge packet in a given channel cell is shifted from the barrier region of the cell to the storage region in response to a voltage pulse applied to the cell. All the channel cells 4 in the imaging part: are grouped into a plurality of pairs, and the cells 4 in each pair are connected to the terminals A1 and A2, respectively. Likewise, the channel cells 5 in the memory part are grouped into a plurality of pairs, and the cells 5 in each pair are connected to the terminals B1 and B2, respectively.

Figure 12:
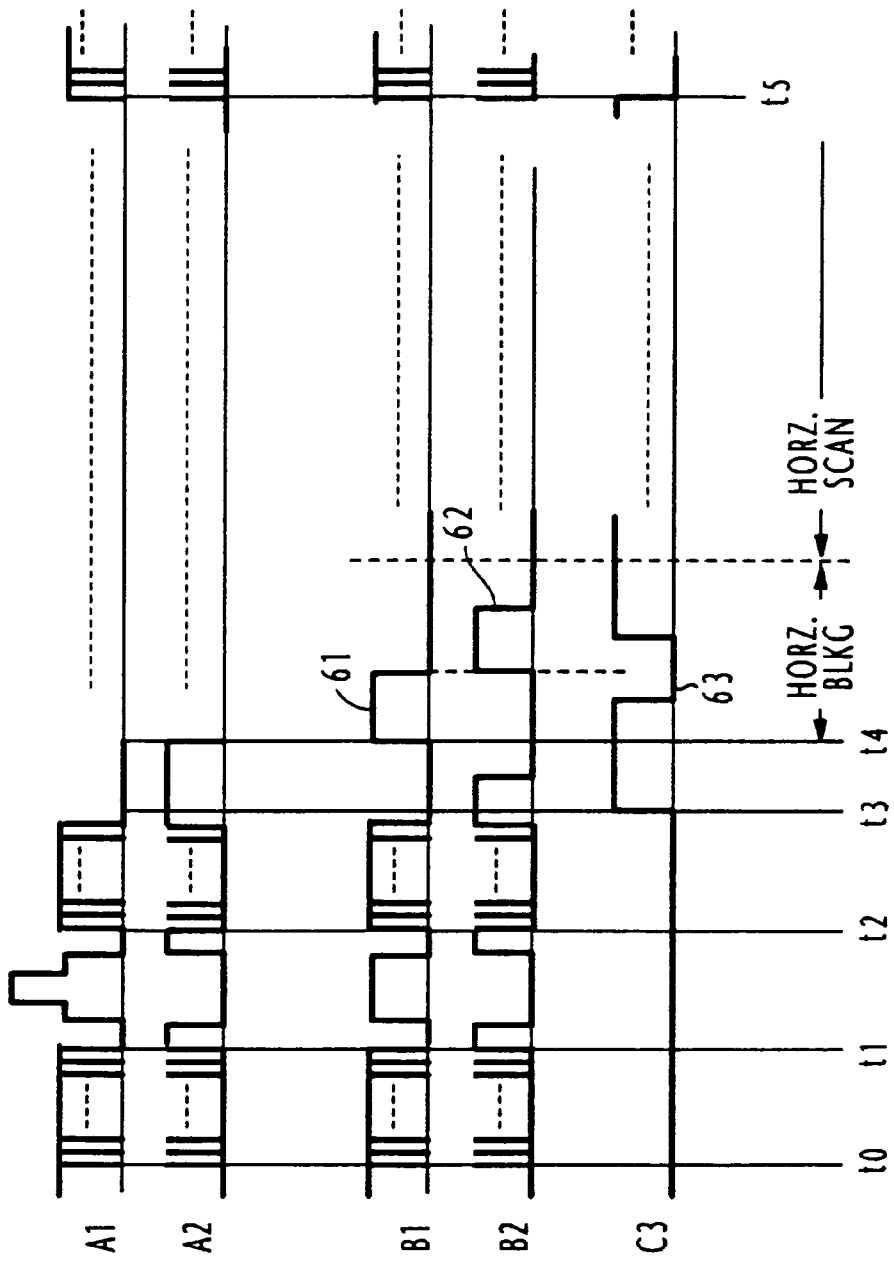
FIG. 12 is a timing diagram of the operation of the control unit of FIG. 11.

As shown in FIG. 12, after spurious charges are purged during period $t_0$–$t_1$, an excitation voltage pulse is applied to the terminal A1 during period $t_1$–$t_2$ to simultaneously move charge packets from all the photodiodes 1 to corresponding channel cells 4. All the charge packets are then transferred to the memory part during period $t_2$–$t_3$. All charge packets are simultaneously stored into corresponding storage cells 70 during period $t_3$–$t_4$ by the application of a low voltage to terminals B1 and B2 and a high voltage to terminal C3.

During a horizontal blanking period starting at time t4, high voltage pulses 61 and 62 are successively applied to terminals B1 and B2, respectively, and a low voltage pulse 63 to terminal C3. Note that the trailing edge of pulse 61 coincides with the leading edge of pulse 62 when the terminal C3 is at low level. In response to these pulses, all the charge packets are moved from storage cells 70 to those channel cells 5 which are connected to terminal B1, and then shifted downwards to those channel cells 5 connected to terminal B2, so that the charge packets of the bottom row are delivered to the horizontal register 6 during a subsequent horizontal scan period. The remaining charge packets are then withdrawn to corresponding storage cells 70 which are maintained at high voltage level as shown in FIG. 12 during the horizontal scan period.

What is claimed is:

1. A two-dimensional image sensor comprising:
   a matrix array of photodiodes;
   a plurality of vertical shift registers horizontally divided into an imaging part and a memory part, the imaging part being arranged to receive charge packets from the photodiodes and the memory part being arranged to receive said charge packets from the imaging part;
   a plurality of vertical arrays of storage cells, the storage cells of each vertical array being arranged in a charge transfer relationship with a corresponding one of the vertical registers of the memory part; and
   a horizontal shift register arranged to receive charge packets from the memory part and sequentially deliver the received charge packets to external circuitry;
   wherein the memory part of each of the vertical registers comprises a series of channel cells, each of said channel cells and each of said storage cells being formed as a semiconductor structure on a substrate, said semiconductor structure comprising:
   a first layer of first conductivity type formed on said substrate;
   a second layer of second conductivity type on said first layer, said first and second layers having a first portion for defining the channel cell and a second portion adjacent to the first portion; and
   a region of first conductivity type in said second layer for defining the storage cell with the second portion of the first and second layers, said first and second portions being in a charge transfer relationship with each other.

2. A two-dimensional image sensor as claimed in claim 1, further comprising a region of second conductivity type formed in said first layer adjacent said region of first conductivity type.

3. A two-dimensional image sensor comprising:
   a matrix array of photodiodes;
   a plurality of vertical shift registers horizontally divided into an imaging part and a memory part;
   a plurality of vertical arrays of storage cells for receiving charge packets from the memory part of the vertical shift registers during said vertical blanking period;
   a horizontal shift register arranged to receive charge packets row by row from said memory part; and
   control circuitry for controlling, during a vertical blanking period, said vertical registers and said storage cells for transferring charge packets from the photodiodes to the imaging part, transferring the charge packets from the imaging part via said memory part to said storage cells, controlling, during a horizontal blanking period, said storage cells and said memory part for restoring the charge packets from the storage cells to the memory part, shifting the restored charge packets along the memory part by the distance of a row to said horizontal shift register and withdrawing remaining charge packets from the memory part to said storage cells, and controlling, during a horizontal scan period, said memory part, said storage cells and said horizontal shift register, for storing the withdrawn charge packets in the storage cells, applying such a potential to said memory part that no dark currents substantially exist therein and transferring charge packets from said horizontal shift register to external circuitry.

4. A two-dimensional image sensor as claimed in claim 3, wherein the memory part of each of the vertical registers comprises a series of channel cells, each of said channel cells and each of said storage cells are formed as a semiconductor structure on a substrate, said semiconductor structure comprising:
   a first layer of first conductivity type formed on said substrate;
   a second layer of second conductivity type on said first layer, said first and second layers having a first portion for defining the channel cell and a second portion adjacent to the first portion; and
   a region of first conductivity type in said second layer for defining the storage cell with the second portion of the first and second layers, said first and second portions being in a charge transfer relationship with each other,
   said control means maintaining said first and second portions at opposite potentials during each of said horizontal scan periods.

5. A two-dimensional image sensor as claimed in claim 4, further comprising a region of second conductivity type formed in said first layer adjacent said region of first conductivity type.

6. A two-dimensional image sensor as claimed in claim 3, wherein the imaging part of the vertical shift registers is divided into four groups of successive phase, and the memory part of the vertical shift registers is divided into four groups of successive phases.

7. A two-dimensional image sensor as claimed in claim 3, wherein the imaging part of the vertical shift registers is divided into two groups of successive phases, and the memory part of the vertical shift registers is divided into two groups of successive phases.

8. A two-dimensional image sensor comprising:
   a matrix array of photodiodes;
   a plurality of vertical shift registers horizontally divided into an imaging part and a memory part;
   a plurality of vertical arrays of storage regions for receiving charge packets from the memory part of the vertical shift registers during a vertical blanking period;
   a horizontal shift register arranged to receive charge packets row by row from said memory part; and
   control circuitry for controlling, during a vertical blanking period, said vertical registers and said storage regions for transferring charge packets from a first group of rows of the photodiodes to the imaging part, transferring the charge packets from the imaging part via said memory part to a first group of rows of said storage regions and subsequently transferring charge packets from a second group of rows of the photodiodes to the imaging part, transferring the charge packets from the imaging part via said memory part to a second group of rows of said storage regions, controlling, during a horizontal blanking period, said storage regions and said memory part for restoring all the charge packets from all the storage regions to the memory part, shifting the restored charge packets along the memory part by the distance of a row to said horizontal shift register and withdrawing remaining charge packets from the memory part to said storage regions, and controlling, during a horizontal scan period, said storage regions, said memory part and said horizontal shift register, for storing the withdrawn charge packets in the storage regions, applying such a potential to said memory part that no dark currents substantially exist therein and transferring charge packets from said horizontal shift register to external circuitry.

9. A two-dimensional image sensor as claimed in claim 8, wherein the memory part of each of the vertical registers comprises a series of channel cells, each of said channel cells and each of said storage regions are formed as a semiconductor structure on a substrate, said semiconductor structure comprising:

a first layer of first conductivity type formed on said substrate;

a second layer of second conductivity type on said first layer, said first and second layers having a first portion for defining the channel cell and a second portion adjacent to the first portion; and a region of first conductivity type in said second layer for defining the storage region with the second portion of the first and second layers, said first and second portions being in a charge transfer relationship with each other, said control means maintaining said first and second portions at opposite potentials during each of said horizontal scan periods.

10. A two-dimensional image sensor as claimed in claim 9, wherein said region of first conductivity type is divided into two separate parts.

11. A two-dimensional image sensor as claimed in claim 9, further comprising a region of second conductivity type formed in said first layer adjacent said region of first conductivity type.

12. A two-dimensional image sensor as claimed in claim 8, wherein said vertical arrays of storage regions comprise a plurality of vertical arrays of first storage cells and a plurality of vertical arrays of second storage cells associated respectively with the first storage regions.

13. A two-dimensional image sensor as claimed in claim 8, wherein said first and second groups of rows are groups of alternate rows.

14. In a two-dimensional image sensor comprising a matrix array of photodiodes for producing charge packets, a plurality of vertical shift registers divided into an imaging part and a memory par, a plurality of vertical arrays of storage cells, and a horizontal shift register, a method comprising the steps of a) transferring charge packets from said photodiodes to said imaging pan of the vertical shift registers;

b) shifting the charge packets from the imaging part to the memory part of the vertical shift registers during a vertical blanking period;

c) withdrawing the charge packets from said memory part to said storage cells during said vertical blanking period;

d) shifting charge packets from said storage cells back to said memory part during a horizontal blanking period;

e) shifting the charge packets in said memory part of the vertical shift registers by the distance of a row towards said horizontal shift register during said horizontal blanking period;

f) withdrawing remaining charge packets from said memory part to said storage cells during said horizontal blanking period;

g) maintaining said memory part of the vertical shift registers during a horizontal scan period at such a potential that no dark currents substantially exist therein;

h) sequentially shifting charge packets through said horizontal shift register to external circuitry during said horizontal scan period; and i) repeating the steps (d) to (h) a predetermined number of times during said vertical scan period.

15. A two-dimensional image sensor comprising a matrix array of photodiodes divided into first group rows and second group rows for producing charge packets, a plurality of vertical shift registers divided into an imaging part and a memory part, a plurality of vertical arrays of storage cells, and a horizontal shift register for receiving charge packets from the memory part of the vertical shift registers during each of horizontal blanking periods and delivering the received charge packets to external circuitry during a horizontal scan period, a method comprising the steps of:

a) transferring charge packets from said photodiodes of the first group rows to said imaging part of the vertical shift registers to produce first group charge packets;

b) shifting the first group charge packets from said imaging part to said memory part during a vertical blanking period;

c) withdrawing remaining charge packets from said memory part to said storage cells during said vertical blanking period;

d) transferring charge packets from said photodiodes of the second group rows to said imaging part to produce second group charge packets;

e) shifting the second group charge packets from said imaging part to said memory part during said vertical blanking period;

f) withdrawing remaining charge packets from said memory part to said storage cells during said vertical blanking period;

g) shifting all charge packets from said storage cells back to said memory part during a horizontal blanking period;

h) shifting all the charge packets in said memory part by the distance of a row towards said horizontal shift register during said horizontal blanking period;

i) withdrawing remaining charge packets from said memory part to said storage cells during said horizontal blanking period;

j) maintaining said memory part during a horizontal scan period at such a potential that no dark currents substantially exist therein;

k) sequentially shifting charge packets in said horizontal shift register to external circuitry during said horizontal scan period; and l) repeating the steps (g) to (k) a predetermined number of times during a vertical scan period.

* * * * *

UNITED STATES PATENT AND TRADEMARK OFFICE
CERTIFICATE OF CORRECTION

PATENT NO. : 5,900,769
DATED : May 4, 1999
INVENTOR(S) : Akihito TANABE

It is certified that error appears in the above-identified patent and that said Letters Patent is hereby corrected as shown below:

| | | |
|---|---|---|
| Column 1, | line 42, | delete "die" and insert --the--. |
| Column 4, | line 38, | delete "shaft" and insert --shift--. |
| Column 5, | line 16, | delete "camel" and insert --channel--. |
| Column 7, | line 39, | delete "leading" and insert --trailing--. |
| Column 11, | line 1, | delete "t4" and insert --$t_4$--. |
| Column 13, | line 53, | delete "par" and insert --part--. |

Signed and Sealed this

Fourth Day of January, 2000

Attest:

Attesting Officer

Acting Commissioner of Patents and Trademarks